United States Patent [19]
Ribner

[11] Patent Number: 5,084,639
[45] Date of Patent: Jan. 28, 1992

[54] LOW FREQUENCY NOISE CANCELING PHOTODETECTOR PREAMPLIFIER USEFUL FOR COMPUTERIZED TOMOGRAPHY

[75] Inventor: David B. Ribner, Schenectady, N.Y.

[73] Assignee: General Electric Company, Schenectady, N.Y.

[21] Appl. No.: 583,745

[22] Filed: Sep. 17, 1990

[51] Int. Cl.[5] .................... G06G 7/12; H03K 3/42; H03K 5/153; H03K 17/687

[52] U.S. Cl. .................... 307/490; 307/494; 307/311; 307/350; 307/572; 330/9; 250/370.09

[58] Field of Search ............... 307/490, 494, 311, 350, 307/572, 580, 355, 356; 330/9; 250/370.09

[56] References Cited

U.S. PATENT DOCUMENTS

| | | | |
|---|---|---|---|
| 4,258,719 | 3/1981 | Lewyn | 307/311 |
| 4,260,951 | 4/1981 | Lewyn | 307/311 |
| 4,665,327 | 5/1987 | Bacrania et al. | 307/494 |
| 4,769,753 | 9/1988 | Knudson et al. | 307/110 |

OTHER PUBLICATIONS

R. D. Yen et al., "A MOS Switched-Capacitor Instrumentation Amplifier", IEEE J. Solid-State Circuits; vol. SC-17, Dec. 1982, pp. 1008-1013.

D. J. Allstot, "A Precision Variable-Supply CMOS Comparator", IEEE J. Solid-State Circuits; vol. SC-17, Dec. 1982; pp. 1080-1087.

B. S. Song et al., "A Precision Curvature-Compensated CMOS Bandgap Reference"; IEEE J. Solid-State Circuits, vol. SC-18, Dec. 1983, pp. 634-643.

B. S. Song et al., "A 12-bit 1-Msample/s Capacitor Error Averaging Pipelined A/D Converter", J. IEEE Solid-State Circuits, vol. 23; No. 6, Dec. 1988, pp. 1324-1333.

A. S. Sedra et al., "Microelectronic Circuits", Holt, Rinehart and Winston, New York, N.Y.; 1982, pp. 41-43.

Primary Examiner—Stanley D. Miller
Assistant Examiner—Trong Phan
Attorney, Agent, or Firm—Marvin Snyder; James C. Davis, Jr.

[57] ABSTRACT

A preamplifier interfaces low level current-mode signals, such as from a photodetector in a computerized tomography system, to a corresponding voltage-mode signals, with a dynamic range on the order of 120 dB. The preamplifier can be implemented in CMOS technology to allow for complete integration of the computerized tomography interface function, including analog-to-digital conversion, of several channels in a single integrated circuit. The CMOS circuit accepts a current signal at its input and, after integration of the signal, produces a voltage output wherein the low frequency noise that is normally encountered with MOS transistors is cancelled through the use of correlated-double sampling. The circuit limits high frequency noise through use of low-pass filtering.

12 Claims, 4 Drawing Sheets (INTERVAL $\Delta_1$)

(INTERVAL $\Delta_2$)

(INTERVAL $\Delta_3$)

LOW FREQUENCY NOISE CANCELING PHOTODETECTOR PREAMPLIFIER USEFUL FOR COMPUTERIZED TOMOGRAPHY

BACKGROUND OF THE INVENTION

1. Field of the Invention

This invention relates to low noise solid-state preamplifier circuits and, more particularly, to a two-stage integrated circuit amplifier having a three-phase double auto-zeroing switching sequence which enables cancellation of offsets, charge injection, kT/C noise and low frequency flicker noise. The circuit, which is particularly useful in computerized tomography applications, also moderates thermal noise by employing a filtering method that is merged with the overall frequency compensation of the preamplifier.

2. Description of the Prior Art

In computerized tomography (CT), X-ray signals are detected using an array of photodiodes mounted directly behind scintillators. The resolvable dynamic range of the signal to be detected is on the order of one million to one, i.e., 120 dB, due to the range of X-ray attenuation encountered in the human body. Economic and system architectural advantages arise from the ability to completely integrate the preamplifier and subsequent analog-to-digital converter (ADC) together for several CT channels on a single complementary metal oxide semiconductor (CMOS) monolithic integrated circuit (IC). However, the noise properties and power supply levels of CMOS have heretofore limited the dynamic range of any signal conditioning function to roughly 95 dB. Therefore, it would be desirable to achieve 120 dB dynamic range and corresponding linearity in a CMOS photodetector preamplifier circuit.

Prior implementations of CT preamplifiers have utilized discrete components, including low-noise junction field effect transistor (JFET) input bipolar operational amplifiers, to achieve the desirable wide dynamic range. While a low-noise fully integrated CMOS preamplifier for CT has not before been implemented, some CMOS instrumentation amplifiers display certain similarities thereto; however, their basic functions are different. Examples of these CMOS instrumentation amplifiers are presented, for example, by R. D. Yen and P. R. Gray in "A MOS Switched-Capacitor Instrumentation Amplifier", *IEEE J. Solid-State Circuits*, Vol. SC-17, December 1982, pp. 1008–1013; D. J. Allstot in "A Precision Variable-Supply CMOS Comparator", *IEEE J. Solid-State Circuits*, Vol. SC-17, December 1982, pp. 1080–1087; B. S. Song and P. R. Gray in "A Precision Curvature-Compensated CMOS Bandgap Reference", *IEEE J. Solid-State Circuits*, Vol. SC-18, December 1983, pp. 634–643; and B. S. Song, M. F. Tompsett and K. R. Lakshmikumar in "A 12-Bit 1-Msample/s Capacitor Error-Averaging Pipelined A/D Convertor", *IEEE J. Solid-State Circuits*, Vol. 23, December 1988, pp. 1324–1333. The circuits disclosed in these journal articles address amplification of voltage-mode signals, whereas a photodetector preamplifier must amplify current-mode signals.

SUMMARY OF THE INVENTION

It is therefore an object of the present invention to provide apparatus to interface low level current-mode signals, such as provided by a photodetector, to corresponding voltage-mode signals providing a dynamic range on the order 120 dB.

Another object of the invention is to provide a preamplifier circuit which can be implemented in CMOS technology to allow for complete integration of the CT interface function, including analog-to-digital conversion, of several channels on a single integrated circuit.

Briefly, in accordance with a preferred embodiment of the invention, a low-noise CMOS circuit is provided to accept a current signal input and produce an output voltage after integration of the signal. A key property of the circuit is its ability to cancel the low frequency noise that is typically encountered when using MOS transistors. The specific MOS transistor nonidealities that arise include transistor flicker and thermal noise, charge injection, voltage offset, device mismatch, and nonlinearity. The preamplifier circuit according to the invention functions to cancel low-frequency noise through use of correlated-double sampling (CDS), and to limit high frequency noise through use of low-pass filtering.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
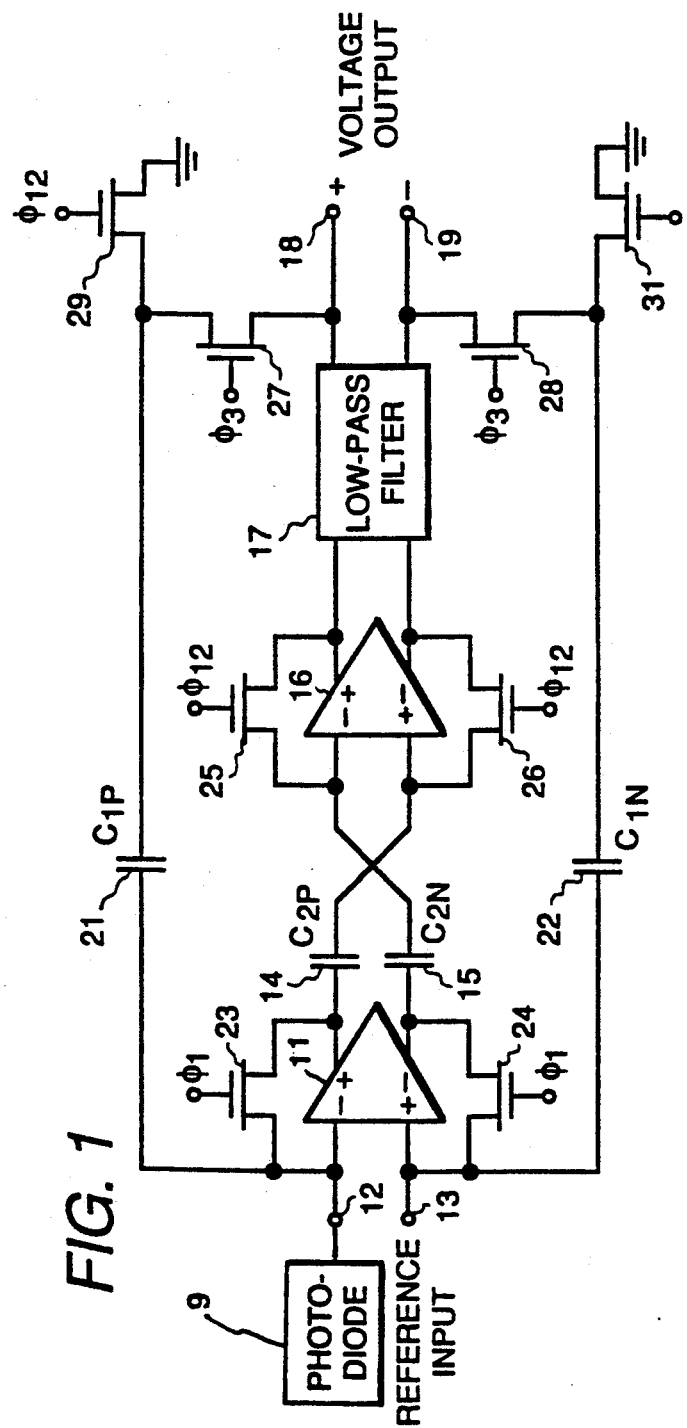
FIG. 1 is a schematic diagram of the basic low-noise preamplifier circuit according to the invention.
Figure 4:
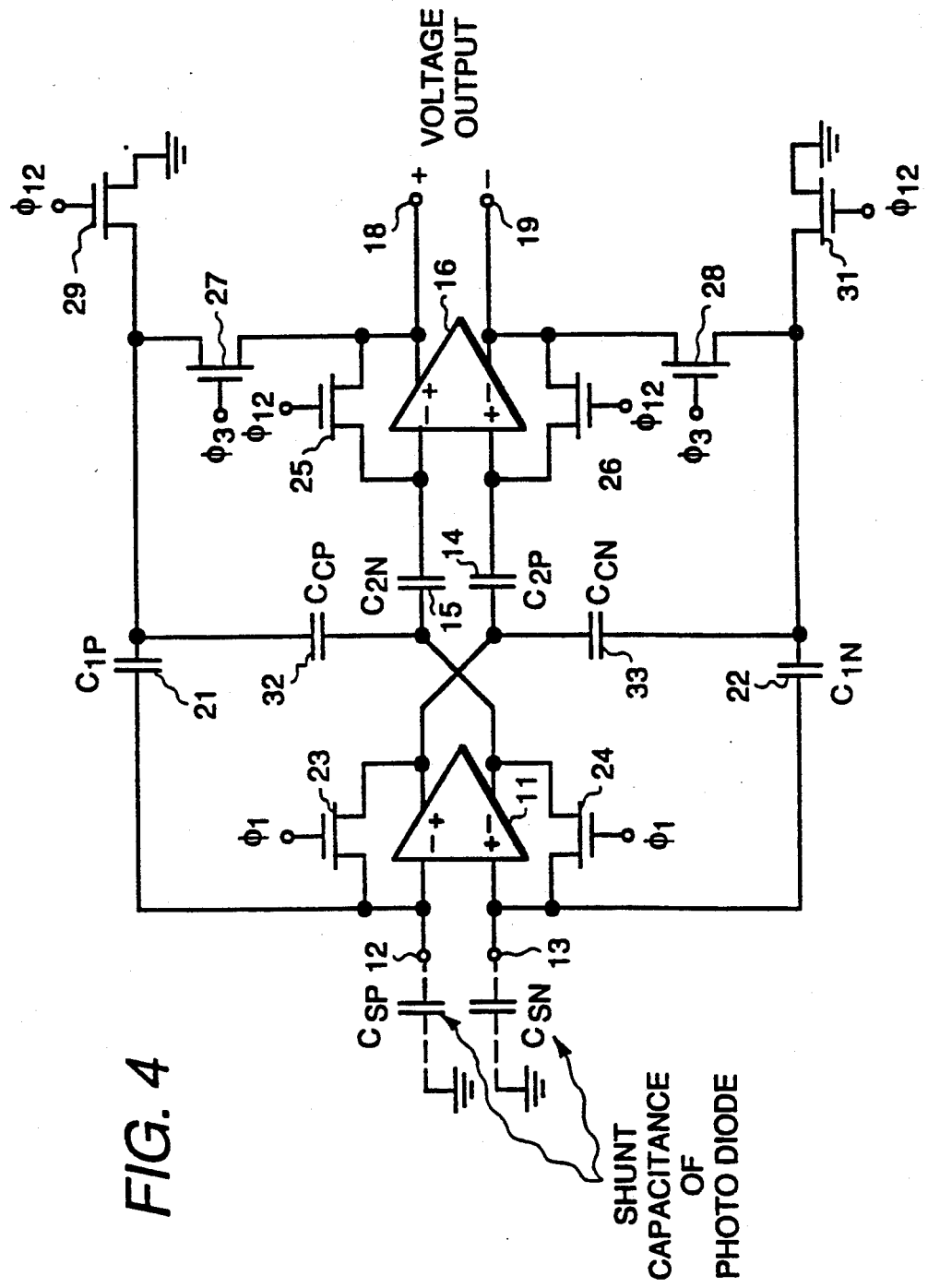
FIG. 4 is a schematic diagram showing the low-noise preamplifier according to the invention, with noise limiting internal frequency compensation.

FIG. 1 illustrates the basic circuit of the low-noise preamplifier of the invention, which comprises a balanced, two-state, capacitively coupled integrator that cancels offset and charge injection almost completely through use of a specific auto-zeroing switching sequence. The first stage comprises an operational amplifier 11 having inverting and non-inverting inputs connected, respectively, to input terminals 12 and 13. The operational amplifier, which has a gain of $A_1$, provides complementary voltage output signals and therefore is hereinafter referred to a having a double-ended (or balanced) output. The output of a photodiode 9 is coupled to the inverting input of amplifier 11 via input terminal 12, and a reference current source (not shown) may be coupled to the non-inverting input of amplifier 11 via input terminal 13. The reference current source may be used to provide dark current correction or, alternatively, it may be omitted. As another alternative, the opposite polarity output terminal of photodiode 9 may be coupled to the non-inverting input of operational amplifier 11 via input terminal 13 (as indicated in FIG. 4) to act as a double-ended input for amplifier 11.

The double-ended outputs of operational amplifier 11 are cross-coupled via interstage coupling capacitors 14 and 15, having capacitance values $C_2$, to the inverting and non-inverting inputs of a second operational amplifier 16, which is substantially identical to the first operational amplifier 11 but having a gain of $A_2$. The double-ended outputs of second amplifier 16 are coupled via a low-pass noise limiting filter 17 to the preamplifier output terminals 18 and 19 to provide an output voltage.

A first feedback path is provided by a capacitor 21 from the positive side of low-pass filter 17 to the inverting input of operational amplifier 11. A second feedback path is provided by a capacitor 22 from the negative side of low-pass filter 17 to the non-inverting input of operational amplifier 11. The feedback capacitors have capacitance values of $C_1$. These feedback paths provide the integration function of the preamplifier.

Figure 2:
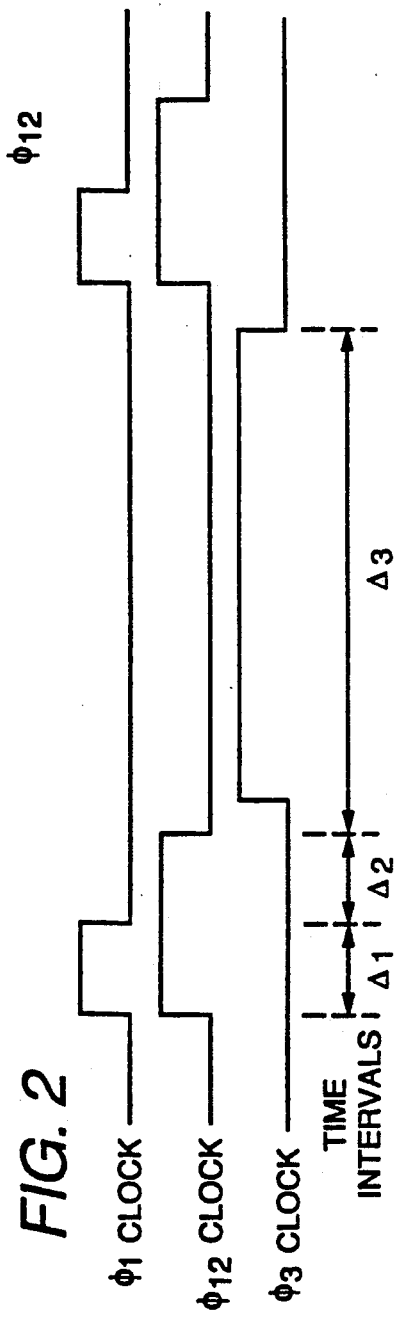
FIG. 2 is a timing diagram showing the related clock waveforms for the circuit shown in FIG. 1.

The circuit includes a number of CMOS switch pairs which are controlled by various clock phases shown in FIG. 2. The first of these CMOS switches are field effect transistors (FETs) 23 and 24 which are respectively coupled between the positive output and inverting input, and the negative output and the non-inverting input, of operational amplifier 11. This pair of FETs is turned on by clock phase $\phi_1$ during time interval $\Delta_1$, as shown in FIG. 2. The next pair of CMOS switch pairs is made up of FETs 25 and 26 which are respectively coupled between the positive output and inverting input and the negative output and non-inverting input of operational amplifier 16. This pair of FETs is turned on by clock phase $\phi_{12}$ during time intervals $\Delta_1$ and $\Delta_2$, as shown in FIG. 2. Another pair of FETs 27 and 28 are respectively coupled between the positive output of low-pass filter 17 and feedback capacitor 21, and the negative output of low-pass filter 17 and feedback capacitor 22. FETs 27 and 28 are turned on by clock phase $\phi_3$ during interval $\Delta_3$. The final switch pair is made up of FETs 29 and 31 which are respectively coupled between the junction of FET 27 and feedback capacitor 21 and circuit ground, and between the junction of FET 28 and feedback capacitor 22 and circuit ground. FETs 29 and 31 are turned on by clock phase $\phi_{12}$ during time interval $\Delta_1$ and $\Delta_2$, as shown in FIG. 2. Time interval $\Delta_2$ represents the time period after clock phase $\phi_1$ but before the end of clock phase $\phi_{12}$.

Figure 3A:
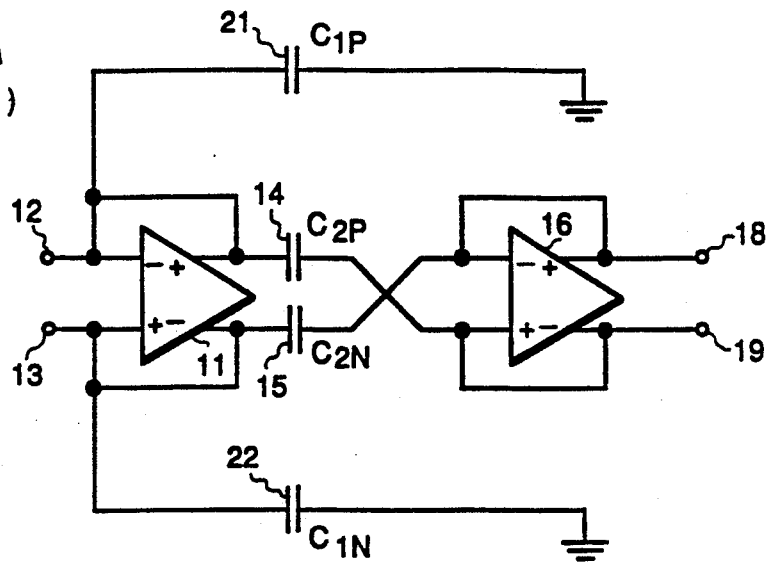
FIGS. 3A, 3B and 3C are simplified schematic diagrams of the basic preamplifier circuit shown in FIG. 1 showing, respectively, the operations of auto-zeroing the first amplifier stage, auto-zeroing the second amplifier stage and integrating the input current signal.
Figure 3B:
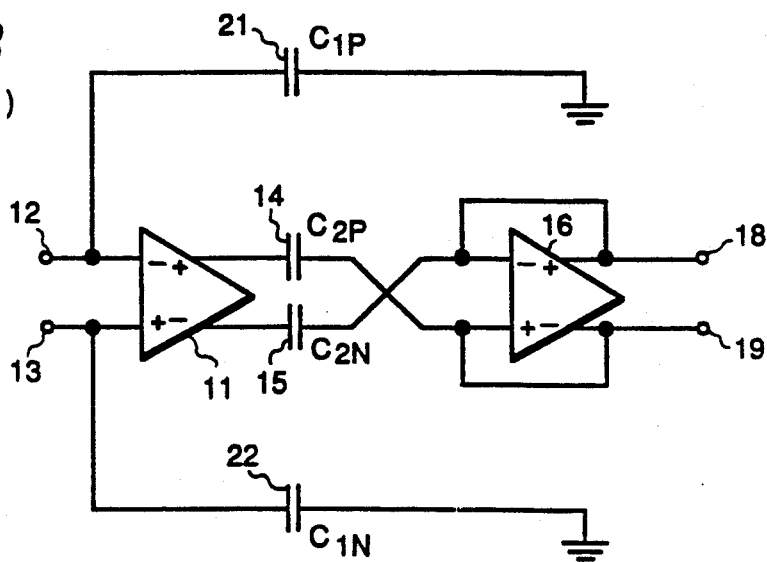
Figure 3C:
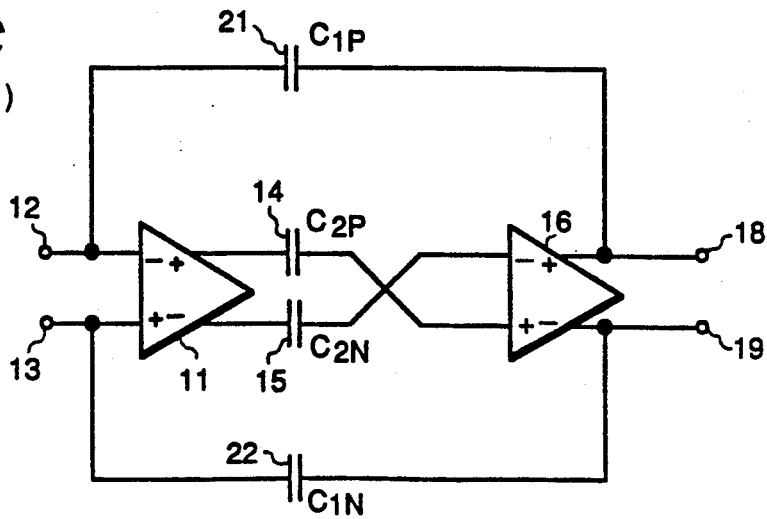

The switching pattern defined by the clock phases shown in FIG. 2 comprises two auto-zeroing phases for amplifiers 11 and 16, respectively, followed by an integration phase for processing the input current signal. The operation of these phases is illustrated in FIGS. 3A, 3B and 3C, respectively. During interval $\Delta_1$, FET switches 23, 24 and 25, 26 are closed so that both amplifiers 11 and 16 are auto-zeroed, making their input-referred offset and noise voltages appear at their respective outputs. FET switches 29 and 31 are also closed at this time, while FET switches 27 and 28 are open. This condition is illustrated in FIG. 3A. At the end of interval $\Delta_1$, FET switches 23 and 24 open, as indicated in FIG. 3B, and the noise and offset of amplifier 11 are sampled by capacitors 21 and 22 and are amplified during interval $\Delta_2$ by the gain of amplifier 11. This amplified error voltage signal is applied to the left-hand sides of capacitors 14 and 15 while their right-hand sides continue to be held at the offset and noise level of amplifier 16. At the end of interval $\Delta_2$, switches 25 and 26 open and the amplified error voltage signal is sampled by amplifier 16 across capacitors 14 and 15. Then at the start of time interval $\Delta_3$, the righthand sides of capacitors 21 and 22 are switched from ground (0 volts) to the outputs of amplifier 16 as shown in FIG. 3C, but the output signal of the preamplifier remains at 0 volts irrespective of all the noise, offset and switch charge injection. The only residual offset at this time is the charge injection and noise from the opening of switches 25 and 26 sampled onto interstage coupling capacitors 14 and 15. This error, however, is reduced by a factor $A_1$, corresponding to the gain of amplifier 11, when input-referred, so that it can be made negligibly small by using sufficient gain in the first stage of the preamplifier.

Interval $\Delta_3$ is the time interval in which the current signal is actually integrated. During this integration interval, input-referred noise of amplifier 11 displaces the output signal with a noise gain of $1/\beta$ where $\beta=C_1/(C_1+C_2)$, where $C_s$ is the shunt capacitance of the photodiode, and this amplified noise can be sampled by a subsequent stage. Therefore, to reduce the output noise level, low-pass filter 17 is included in the loop as shown in FIG. 1 to limit the bandwidth of any broadband thermal noise. It can be shown that the output RMS noise voltage under this circumstance is $$\sigma_{no} = \frac{\epsilon}{2} \sqrt{\frac{\omega_T}{\beta}}, \tag{1}$$

Where $\epsilon$ is the input-referred thermal noise power spectral density in volts per $\sqrt{Hz}$ and $\omega_T$ is the unity gain bandwidth of amplifier 11 cascaded with amplifier 16 and the low-pass filter 17, in radians per second. An effective way to implement this filtering and also provide frequency compensation of the cascade of amplifiers is shown in FIG. 4 wherein capacitors 32 and 33 of capacitance value $C_c$ are added to compensate the preamplifier during phase $\phi_3$ using a pole-splitting technique. The compensation capacitors' value is increased by the Miller effect by an amount $A_2+1$, where $A_2$ is the gain of amplifier 16, thus forming a dominant low-frequency pole at the output of amplifier 11. (The Miller effect is based on Miller's network theorem as described, for example, in A. S. Sedra and K. S. Smith, "MicroElectronic Circuits", *Holt, Rinehart and Winston*, 1982, New York, N.Y., pp 41-43.) The added capacitors 32 and 33 also move the pole formed by capacitive loading at the output of amplifier 16 to a high frequency to ensure stability. In this connection, the closed loop unity gain bandwidth in radians per second is $$\omega_T' = \beta\omega_T = \beta \frac{g_{m1}}{2C_c}, \tag{2}$$

where $g_{m1}$ is the transconductance of amplifier 11.

For this circuit, the output noise can be determined for the case of the thermal noise of the input differential MOSFET pair 23, 24 of amplifier 11. The thermal noise power spectral density (PSD) of a MOS transistor is $$\epsilon^2 = 4kT\left[\frac{2}{3g_m}\right]V^2/Hz, \tag{3}$$

where k is Boltzmann's constant and T is temperature in °K. In the present case, amplifier 11 has a transconductance of $g_{m1}$ and the output noise variance is computed as $$\sigma_{no}^2 = 2 \times 4kT \left[ \frac{2}{3g_m} \right] \times \frac{1}{\beta^2} \times \frac{\omega T'}{4} = \frac{2kT}{3\beta C_c}, \quad (4)$$

and the RMS thermal noise is $$\sigma_{no} = \sqrt{\frac{2kT}{3\beta C_c}} \quad (5)$$

Interestingly, this noise does not directly depend on amplifiers 11 and 16; rather, it is dependent on the compensation capacitor size and the feedback factor $\beta$. As an example to illustrate typical noise levels, if $C_c = 200$ pF, $c_1 = 75$ pF and $C_s = 300$ pF, then using Equation (5) the output RMS noise voltage is $\sigma_{no} = 8.3$ $\mu V$.

Figure 5:
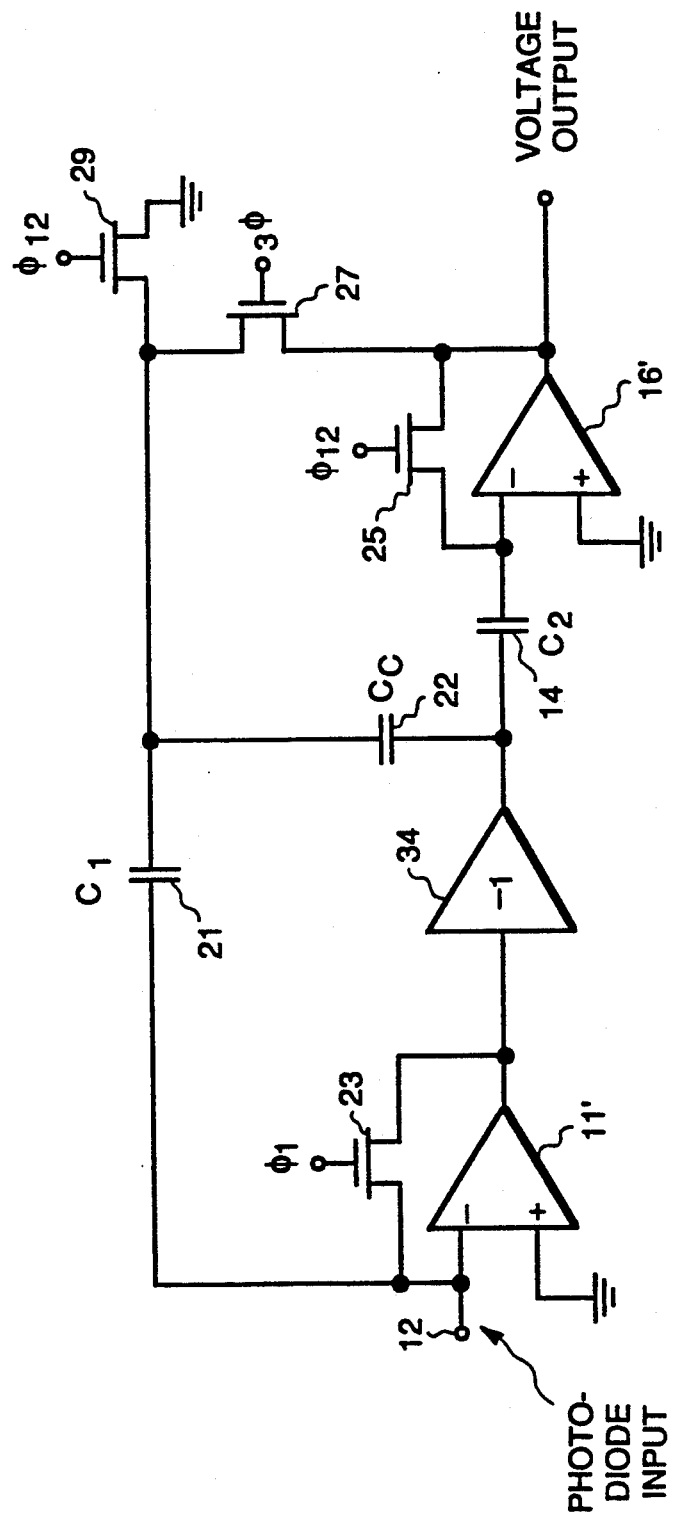
FIG. 5 is a schematic diagram showing a single-ended version of the low-noise preamplifier circuit according to the invention.

Depending upon availability of complementary photodetector output signals, a single-ended circuit may be desirable. For this case, the preamplifier shown in FIG. 5 can be used. In this circuit, amplifiers 11' and 16' are similar to amplifiers 11 and 16 except that they provide a single-ended output rather than a double-ended output. The output signal of amplifier 11' is inverted by inverting amplifier 34 (having a gain of 1) before being applied to interstage coupling capacitor 14. Since this circuit employs a single-ended input and provides a single-ended output, only one switch is required as a replacement, respectively, for each pair of switches shown in FIG. 1; otherwise, operation of the circuit is essentially unchanged.

In summary, the preamplifier circuit according to the invention provides for virtually complete cancellation of offsets and charge injection, rejects flicker noise as per conventional correlated double sampling, and controls thermal noise via band-limiting incorporated into the frequency compensation.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

Having thus described my invention, what I claim as new and desire to secure by Letters Patent is as follows:

1. A wide dynamic range preamplifier circuit for interfacing low level current-mode signals to corresponding voltage-mode signals, comprising:
    first operational amplifier means having an input for receiving low level current-mode signals and having an output for providing a first amplified output voltage signal;
    inverting means coupled to said first operational amplifier means for inverting said first amplified output voltage signal and providing an inverted output signal;
    interstage coupling capacitor means coupled to said inverting means for sampling said inverted output signal;
    second operational amplifier means having an input coupled to said interstage coupling capacitor means and having an output for providing a second amplified voltage output signal;
    feedback capacitor means coupled to said input of said first operational amplifier means; and
    switching means for coupling said output of said first operational amplifier means to said input of said first operational amplifier means and said output of said second operational amplifier means to said input of said second operational amplifier means during a first phase of operation, for coupling said output of said second operational amplifier means to said input of said second operational amplifier means during a second phase of operation, thereby auto-zeroing said first and second operational amplifiers, and for coupling said output of said second operational amplifier means to said feedback capacitor means during a third phase of operation.

2. The preamplifier circuit of claim 1 further comprising compensating capacitor means coupled between said inverting means and said output of said second operational amplifier means for providing low-pass filtering and frequency compensation for said first and second operational amplifier means.

3. The preamplifier circuit of claim 1 wherein each of said first and second operational amplifier means comprises a differential amplifier having both an inverting input and a non-inverting input, a first positive output and a second negative complementary output, respectively, and wherein said inverting means comprises one of said inputs of said second differential amplifier means.

4. The preamplifier circuit of claim 1 wherein each of said first and second operational amplifier means comprises a respective single-ended amplifier having a single output.

5. The preamplifier circuit of claim 1 including a photodiode coupled to the input of said first operational amplifier means for producing said low level current-mode signals.

6. A wide dynamic range preamplifier circuit for interfacing low level current-mode signals to corresponding voltage-mode signals, comprising:
    a first operational amplifier having inverting and non-inverting inputs for receiving said low level current-mode signals and having first positive and second negative complementary outputs;
    a second operational amplifier having inverting and non-inverting inputs and having first positive and second negative complementary outputs;
    first and second interstage coupling capacitors coupled, respectively, between said first positive output of said first operational amplifier and said non-inverting input of said second operational amplifier, and between said second negative output of said first operational amplifier and said inverting input of said second operational amplifier;
    first and second feedback capacitors coupled, respectively, to said inverting input of said first operational amplifier, and to said non-inverting input of said first operational amplifier;
    first and second switching means coupled, respectively, between the first positive output and the inverting input of said first operational amplifier, and between the second negative output and the non-inverting input of said first operational amplifier;
    third and fourth switching means coupled, respectively, between the first positive output and the inverting input of said second operational amplifier, and between the second negative output and the non-inverting input of said second operational amplifier; and
    fifth and sixth switching means coupled, respectively, between the first positive output of said second operational amplifier and said first feedback capacitor, and between the second negative output of said second operational amplifier and said second feedback capacitor;

said first, second, third and fourth switching means being turned on during a first timed phase of operation, said first and second switching means thereafter being turned off and said third and fourth switching means remaining on during a second timed phase of operation, and said third and fourth switching means being turned off and said fifth and sixth switching means being turned on during a third timed phase of operation.

7. The preamplifier circuit of claim 6 further comprising low-pass filter means coupled between the positive output of said second operational amplifier means and said first feedback capacitor means, and between the negative output of said second operational amplifier means and said second feedback capacitor means.

8. The preamplifier circuit recited in claim 6 further comprising a seventh switching means coupled between a junction of said fifth switching means with said first feedback capacitor, and circuit ground, and an eighth switching means coupled between a junction of said sixth switching means with said second feedback capacitor, and circuit ground, said seventh and eighth switching means being normally turned on except during said third timed phase of operation.

9. The preamplifier circuit recited in claim 8 wherein each respective one of said switching means comprises a field effect transistor.

10. The preamplifier circuit of claim 6 further comprising:
 a first compensating capacitor coupled between the first positive output of said first operational amplifier and a junction of said first feedback capacitor and said fifth switching means; and
 a second compensating capacitor coupled between the second negative output of said first operational amplifier and a junction of said second feedback capacitor and said sixth switching means, said first and second compensating capacitors providing low-pass filtering and frequency compensation for said first and second operational amplifiers.

11. The preamplifier circuit of claim 6 further comprising low-pass filter means coupled between said first positive output of said second operational amplifier and said fifth switching means and between said second negative output of said second operational amplifier and said sixth switching means, said low-pass filter providing first positive and second negative complementary outputs corresponding to said complementary outputs of said second operational amplifier.

12. The preamplifier circuit of claim 6 including a photodiode coupled to said first operational amplifier inverting and non-inverting inputs for producing said low level current-mode signals.

* * * * *